United States Patent
Sano et al.

(10) Patent No.: US 8,110,322 B2
(45) Date of Patent: Feb. 7, 2012

(54) METHOD OF MASK FORMING AND METHOD OF THREE-DIMENSIONAL MICROFABRICATION

(75) Inventors: Naokatsu Sano, Sanda (JP); Tadaaki Kaneko, Sanda (JP)

(73) Assignee: Riber, Bezons (FR)

( * ) Notice: Subject to any disclaimer, the term of this patent is extended or adjusted under 35 U.S.C. 154(b) by 470 days.

(21) Appl. No.: 11/912,503

(22) PCT Filed: Apr. 25, 2005

(86) PCT No.: PCT/JP2005/007792
§ 371 (c)(1),
(2), (4) Date: Dec. 23, 2009

(87) PCT Pub. No.: WO2006/114886
PCT Pub. Date: Nov. 2, 2006

(65) Prior Publication Data
US 2010/0143828 A1 Jun. 10, 2010

(51) Int. Cl.
*G03F 9/00* (2006.01)
*G03C 5/00* (2006.01)

(52) U.S. Cl. .......... 430/5; 430/296; 430/313; 430/314; 430/315; 430/323; 430/324; 430/325; 430/326; 430/328; 430/330; 430/942; 430/944; 430/945

(58) Field of Classification Search .............. 430/5, 296, 430/313, 314, 315, 323, 324, 325, 326, 328, 430/330, 942, 944, 945
See application file for complete search history.

(56) References Cited

U.S. PATENT DOCUMENTS
5,375,137 A * 12/1994 Hirayama et al. ......... 372/46.01

FOREIGN PATENT DOCUMENTS
| | | | |
|---|---|---|---|
| JP | 05-102616 | * | 4/1993 |
| JP | 06-163402 | * | 6/1994 |
| JP | 2003-179032 | * | 6/2003 |
| JP | 2004-349597 | * | 12/2004 |
| WO | 03/015145 | * | 2/2003 |

OTHER PUBLICATIONS

Tadaaki Kaneko, "Sonoba' Maskless Nanolithography", Denshi Zairyo, Jan. 2002, pp. 50-55.*

* cited by examiner

*Primary Examiner* — Christopher Young
(74) *Attorney, Agent, or Firm* — Young & Thompson

(57) ABSTRACT

The invention provides a method for forming a selective mask on a surface of a layer of $Al_XGa_YIn_{1-X-Y}As_ZP_{1-Z}$ or $Al_XGa_YIn_{1-X-Y}N_ZAs_{1-Z}$ ($0 \leq X \leq 1$, $0 \leq Y \leq 1$, $0 \leq Z \leq 1$), which is a method for forming a mask with a minute width suitable for microfabrication in nano-order.

(1) An energy beam 4a, 4b is selectively irradiated onto a natural oxide layer 2 formed on the surface of the layer 1 of $Al_XGa_YIn_{1-X-Y}As_ZP_{1-Z}$ or $Al_XGa_YIn_{1-X-Y}N_ZAs_{1-Z}$. (2) Of the natural oxide layer 2, parts other than parts onto which the energy beam 4a, 4b has been irradiated is removed by heating. (3) The natural oxide layer 2 of the parts onto which the energy beam 4a, 4b has been irradiated is partially removed by heating while alternatively carrying out a rise and fall in heating temperature.

15 Claims, 4 Drawing Sheets

METHOD OF MASK FORMING AND METHOD OF THREE-DIMENSIONAL MICROFABRICATION

TECHNICAL FIELD

The present invention relates to a method for forming a selective mask on a surface of a layer of $Al_XGa_YIn_{1-X-Y}As_ZP_{1-Z}$ or $Al_XGa_YIn_{1-X-Y}N_ZAs_{1-Z}$ ($0 \leq X \leq 1$, $0 \leq Y \leq 1$, $0 \leq Z \leq 1$), and moreover, to a method for processing a microindentation on the surface of the layer of $Al_XGa_YIn_{1-X-Y}As_ZP_{1-Z}$ or $Al_XGa_YIn_{1-X-Y}N_ZAs_{1-Z}$.

BACKGROUND OF THE INVENTION

For semiconductor microfabrication technologies, currently, 90 nm-level microfabrication has reached the practical stage, however, owing to the rapid sophistication of semiconductor devices in recent years, the importance in development of processing techniques in further microscopic nanoscales has been advocated. Under such circumstances, in Japan, the "Semiconductor MIRAI (Millennium Research for Advanced Information Technology) Project" was started as a national project in fiscal 2001 to work on development and practical use of 45 nm-level microfabrication as a target. In addition, at the private-sector level, the "ASUKA project" was started to work on development and practical use of 65 nm-level microfabrication as a target.

However, with regard to optical lithographic techniques by pattern transfer systems, which are currently the mainstream, despite the aim of higher precision by use of extreme ultraviolet radiation or X-rays for example, these have been approaching the limits in terms of high-precision mask formation, photoresist resolution, process control and the like.

In view of the problems as described above, the inventor of the present application has proposed, in Patent document 1, negative-type lithography for, without removing a natural oxide layer formed on a surface of a GaAs layer, by irradiating Ga ion beams onto this natural oxide layer, substituting either $Ga_2O_3$ or $Ga_2O$ for the oxide layer or generating either $Ga_2O_3$ or $Ga_2O$ on the oxide layer, followed by dry-etching the surface of the GaAs layer by use of a bromide for every single atomic layer.

According to this method, by using the natural oxide layer in place of a mask for the dry etching, it becomes unnecessary to form a special mask for the dry etching and also becomes unnecessary to remove the natural oxide layer. Furthermore, microindentations can be processed with an excellent shape and dimensional reproducibility.

Patent document 1: Japanese Published Unexamined Patent Application No. 2003-51488 (Paragraph number 0012, etc.).

Here, the resolution which has been conventionally used as a barometer of miniaturization does not indicate a resolution in a semiconductor itself to which a final processing whereby an original device function is expressed has been applied, but indicates a resolution after exposure on an organic resist that has been standardized in a lithographic process. The reason is that a large number of steps are required for the final processing to a semiconductor substrate in the conventional lithographic process, and the maximum resolution is determined depending on processing on the organic resist that is the first pattern transfer step. And, in actuality, a pattern fabricated on that organic resist itself is gradually transferred while involving "blurring" as a result of application of a plurality of post processes. In general, because this "blurring" is different depending on an objective processing method and material characteristics, it has been difficult to generally define the blurring. Accordingly, under the present circumstances, the resolution on the organic resist that has been standardized has been competed in the current lithographic process.

SUMMARY OF THE INVENTION

Problems to be Solved by the Invention

However, in the method of the above-described Patent document 1, it has been described that it is desirable to narrow down a diameter of the ion beam irradiated onto the natural oxide layer to 1.5 µm or less, preferably 0.3 µm or less, and more preferably 0.1 µm or less, and with this, a minute mask which is sufficient for microindentation control in nano-order cannot be formed. Moreover, a drawing device which can irradiate such narrow-diameter ion beams is expensive, resulting in an increase in cost.

The present invention has been made in view of the circumstances as described above, and an object thereof is to provide a method for forming a mask with a minute width suitable for microfabrication in nano-order, at a low cost and with high accuracy. Furthermore, a resolution herein aimed at is for the minimum control region in the final processing step on semiconductor substrates.

Means for Solving the Problems and Effects

Problems to be solved by the present invention are as in the above, and means for solving these problems and effects thereof will be described in the following.

According to an aspect of the present invention, a mask forming method as in the following is provided.

A method for forming a selective mask on a surface of a layer of $Al_XGa_YIn_{1-X-Y}As_ZP_{1-Z}$ or $Al_XGa_YIn_{1-X-Y}N_ZAs_{1-Z}$ ($0 \leq X \leq 1$, $0 \leq Y \leq 1$, $0 \leq Z \leq 1$), comprising the steps of:

(1) selectively irradiating an energy beam onto a natural oxide layer formed on the surface of the layer of $Al_XGa_YIn_{1-X-Y}As_ZP_{1-Z}$ or $Al_XGa_YIn_{1-X-Y}N_ZAs_{1-Z}$;

(2) removing, of the natural oxide layer, parts other than parts onto which the energy beam has been irradiated, by heating; and (3) partially removing the natural oxide layer of the parts onto which the energy beam has been irradiated, by heating while alternatively carrying out a rise and fall in heating temperature.

Thereby, since a minute mask with a width smaller than a beam diameter of the energy beam can be formed, a mask with a minute width suitable for microfabrication in nano-order can be formed. In addition, since an energy beam drawing device which can irradiate a beam with narrow diameter is not required, the cost of equipment can be reduced.

In the foregoing mask forming method, it is preferable that, in the step (3), although a semiconductor surface forms a different stable re-composite surface depending on the temperature in vacuum, by producing a dynamic stride across a phase transition point where re-composition changes by intentionally repeating a rise and fall in temperature, surface diffusion of substrate composition atoms on a surface of a semiconductor substrate is excited also in low-temperature regions, the natural oxide layer excluding minute center parts onto which the energy beam has been irradiated and which is great in intensity of energy intensity distribution is removed.

Thereby, a mask formation on an order markedly smaller than a diameter of the irradiated energy beam, on a nano-order for example, can be realized.

In the foregoing mask forming method, it is preferable that, in the step (1), any of an electron beam, an ion beam, a laser beam, and an infrared rays is employed as the energy beam.

In addition, a three-dimensional microfabrication method of the present invention is characterized by forming self-assembled microindentations by selectively growing III-V family compound semiconductor crystals on the surface of the layer of $Al_XGa_YIn_{1-X-Y}As_ZP_{1-Z}$ or $Al_XGa_YIn_{1-X-Y}N_ZAs_{1-Z}$ by a molecular beam epitaxial growth method after selectively forming the above-mentioned mask.

Thereby, a minute three-dimensional processing can be realized. In particular, a mask formed by the above-described method plays the role of a trigger for a nucleus formation to an initial stage of diffusion of a III-V family compound semiconductor, and thereafter, the III-V family compound semiconductor gradually grows while performing self-assembly, therefore, by appropriately controlling growth conditions, extremely minute three-dimensional structures can be realized irrespective of the mask width.

In the foregoing three-dimensional microfabrication method, it is preferable that, by supplying a dopant after the selective self-assembly growth of the III-V family compound semiconductor crystals, n-channels are self-formed on some facet surfaces of the III-V family compound semiconductor crystals and p-channels are self-formed on other facet surfaces respectively.

Thereby, minute transistors can be formed by fewer steps.

In the foregoing three-dimensional microfabrication method, it is preferable that, by supplying Si as the dopant as molecular beams, n-type semiconductors are formed on crystal orientation (100) surfaces and p-type semiconductors are formed on crystal orientation (n11) A surfaces in an identical step. Here, n is an integer, for example, n=3, but is not limited hereto.

Thereby, minute transistors can be formed by fewer steps, and p-n control of three-dimensional microindentation surfaces can be carried out in one lump sum.

In a three-dimensional microfabrication method of the present invention, it is preferable that microindentations are formed in nano-order on the surface of the layer of $Al_XGa_YIn_{1-X-Y}As_ZP_{1-Z}$ or $Al_XGa_YIn_{1-X-Y}N_ZAs_{1-Z}$ by dry etching by supplying a bromide as molecular beams after forming the above-mentioned selective mask.

Thereby, minute three-dimensional structures can be realized.

In the foregoing mask forming method, it is preferable that, by selectively irradiating the energy beam while changing the amount of Dowes in the step (1), parts of the natural oxide layer are made to function as a negative-type mask, and parts are made to function as a positive-type mask.

Thereby, a single natural oxide layer can be controlled to make parts thereof function as a positive-type mask and make the rest thereof function as a negative-type mask. Accordingly, the degree of freedom in formation of three-dimensional structures is improved.

In addition, the three-dimensional microfabrication method of the present invention is characterized by forming self-assembled microindentations by selectively growing III-V family compound semiconductor crystals on the surface after forming the negative-type mask and the positive-type mask.

In this method, the III-V family compound semiconductor is, at the initial stage of diffusion, adsorbed to the negative-type mask and repulsed to the positive-type mask. By utilizing this principle, various shapes of three-dimensional structures can be formed.

In the foregoing three-dimensional microfabrication method, it is preferable that microindentations are selectively formed in nano-order by self-assembly growth of III-V family compound semiconductor crystals on a rear surface of the negative-type mask and by self-assembly growth of III-V family compound semiconductor crystals at gaps without the positive-type mask.

Thereby, various shapes of minute three-dimensional structures can be realized.

In addition, a three-dimensional microfabrication method of the present invention is characterized by forming microindentations on the surface of the layer of $Al_XGa_YIn_{1-X-Y}As_ZP_{1-Z}$ or $Al_XGa_YIn_{1-X-Y}N_ZAs_{1-Z}$ by dry etching by use of a bromide after forming the above-mentioned negative-type mask and the positive-type mask.

Thereby, since etching can be carried out so that negative-type mask parts and positive-type mask parts have a difference in elevation, various shapes of three-dimensional structures can be formed in nano-order.

DESCRIPTION OF REFERENCE NUMERALS

1 GaAs substrate as GaAs layer (layer of $Al_XGa_YIn_{1-X-Y}As_ZP_{1-Z}$ or $Al_XGa_YIn_{1-X-Y}N_ZAs_{1-Z}$)

2 Natural oxide layer

3a $Ga_2O_3$ (positive-type mask)

3b $Ga_2O_3$ (negative-type mask)

4a Electron beam with a large amount of line Dowes (energy beam)

4b Electron beam with a small amount of line Dowes (energy beam)

5 GaAs grown crystal

6a GaAs amorphous crystal
6b GaAs monocrystal
6c GaAs monocrystal

BEST MODE FOR CARRYING OUT THE INVENTION

Next, an explanation of embodiments of the present invention will be made.

First Embodiment

Figure 1:
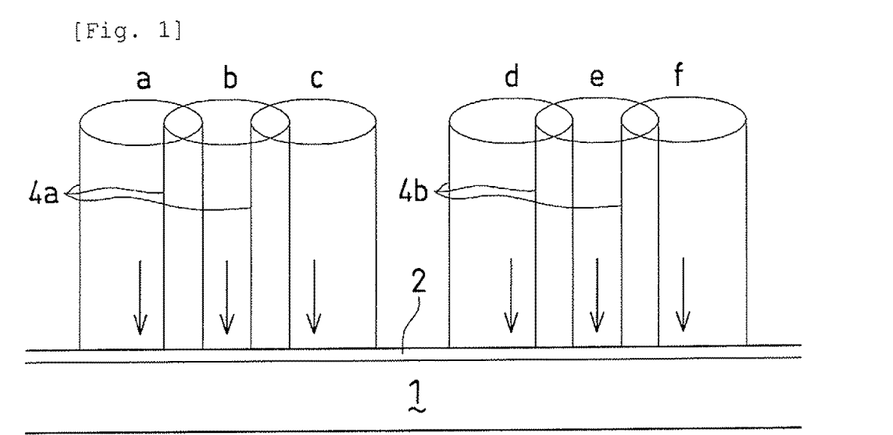
FIG. 1 is a schematic view showing a state where electron beams are irradiated onto a natural oxide layer formed on a surface of a GaAs substrate.

In a first embodiment, as shown in the left side of FIG. 1, to a GaAs substrate 1, without removing a natural oxide layer 2 of $As_2O_3$, $As_2O$, or the like formed naturally on its surface, by means of a publicly-known electron beam drawing device, an electron beam (energy beam) 4a was irradiated in a high vacuum toward the surface of this natural oxide layer 2 (step 1).

Irradiation of the above-described electron beam 4a was carried out with its beam diameter of 1 μm, an acceleration voltage of 50 kV or less, and the amount of line Dowes of $2.5 \times 10^{-1}$ electron/cm, in a single line mode. Here, the amount of line Dowes of the electron beam 4a was controlled by appropriately changing the amperage and irradiation time of the electron beam.

Here, an irradiation interval of the electron beam 4a (a distance by which, after an electron beam was irradiated, this was translated to a line to be irradiated next) was 50 nm. Namely, the electron beam 4a was irradiated a plurality of times while shifting the line from "a" to "b" to "c" by 50 nm.

Figure 2:
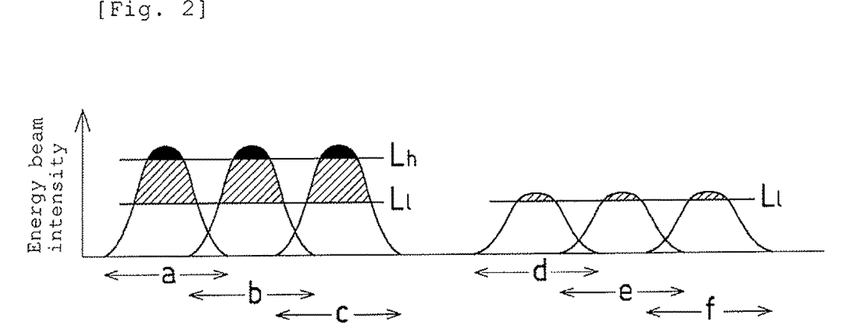
FIG. 2 is a graphical view showing intensity distributions of electron beams irradiated onto the natural oxide layer formed on the surface of the substrate.

By this irradiation of the electron beam 4a, the oxide such as $As_2O_3$, $As_2O$, or the like of the natural oxide layer 2 having a thickness of 3 nm was replaced by chemically stable $Ga_2O_3$. Here, the natural oxide layer 2 was extremely sensitively reformed with respect to an energy distribution (Gaussian distribution as being a forward scattering component of the incident electron beam which has been overlapped with a proximity effect to be described later, see the left side of FIG. 2) when the electron beam 4a was irradiated.

Here, a region (line width) which was reformed by a one-time irradiation of the election beam 4a was approximately 7 μm. The cause of the line width of the reformed region being greater than the electron beam diameter (1 μm) as such is secondary electron scattering from the inside of the natural oxide layer 2 and substrate 1 when the electron beam 4a was irradiated (proximity effect).

Next, the GaAs layer 1 whose surface oxide film 2 had been partially replaced by $Ga_2O_3$ was heated in a depressurized condition of approximately $10^{-3}$ Pa or less. Concretely, as shown in a transition of heating temperature of FIG. 7, the temperature was raised to 580° C. to 630° C. (step 2). Thereby, parts other than the parts onto which the electron beam 4a had been irradiated, (namely non-reformed region), was removed by thermal desorption.

Figure 7:
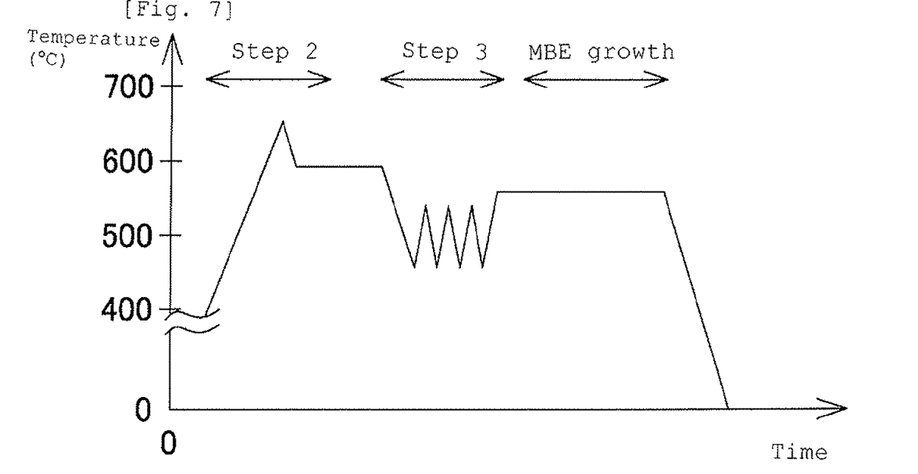
FIG. 7 is a graphical view showing changes in heating temperature in a heating step.

Subsequently, as shown in FIG. 7, while maintaining the above-described vacuum condition, in a such manner that the above-described heating temperature was once lowered to approximately 450° C., then raised to approximately 540° C., and again lowered to approximately 450° C., a rise and fall in the heating temperature was alternatively repeated a few times to a few tens of times (step 3). Thus, of the regions of the natural oxide layer 2 reformed by the electron beam 4a irradiation, minute center parts corresponding to parts where an energy distribution intensity of this electron beam 4a is greater than a specific level (painted-in-black parts 3a with the amount of Dowes greater than a critical level Lh and shaded parts 3b with the amount of Dowes greater than Ll shown in FIG. 2) were left, while the other parts of the natural oxide layer was removed by thermal desorption, to reach a state of FIG. 3. The left region (line width) of the oxide layer 3a was approximately 10 nm.

Namely, the surface of the GaAs layer 1 forms a stable re-composite surface in vacuum, however, from a specific temperature as a border, a re-composite surface with a different structure is to be formed (phase transition). This temperature to serve as a boundary is called a "phase transition point", and by intentionally alternatively repeating a rise and fall in the heating temperature so as to stride across this phase transition point (or as to reach this phase transition point), a phase transition of the surface of the GaAs layer 1 is repeatedly produced, whereby the natural oxide layer 2 corresponding to parts with a weak energy distribution intensity of the electron beam 4a (regions where the degree reformation was insufficient although a reformation has been performed) can be desorbed. Consequently, of the aforementioned regions onto which the electron beam 4a has been irradiated, the natural oxide layer 2 at parts other than the minute center parts can be removed. Here, in the GaAs layer, the transfer point is approximately 540° C.

Consequently, a minute mask 3a whose line width is approximately 10 nm was able to be formed on the GaAs layer. Namely, a minute mask which can be sufficiently utilized for microfabrication control in nano-order was able to be formed. Here, by controlling the temperature width of a rise and fall in the heating temperature, the number of repetition times of the rise and fall, and the like, a critical level (level L in the graph of FIG. 2) of the amount of line Dowes to leave the natural oxide layer 2 as a mask 3a can be changed, whereby the width of the mask 3a to be formed can be controlled at a desirable width of approximately a few nanometers to 5 μm.

Subsequently, after forming the mask 3a as described above, by a molecular beam epitaxial growth method (hereinafter, abbreviated to an "MBE method"), GaAs (a III-V family compound) was selectively grown on the GaAs layer 1 of the side where the natural oxide layer 2 had been desorbed. This MBE method was performed with crystal growth conditions: a growth direction of GaAs being aligned with a surface orientation (100) of the GaAs layer, a GaAs crystal growth temperate of 500° C. to 650° C.; a flux ratio of Ga atoms to As 4 molecules $F_{As}/F_{Ga}$ of 5 to 20; a GaAs crystal growth rate of 0.1 to 2 ML/sec (molecular layer/second: converted to a growth rate for a two-dimensional thin film); and a layer thickness of a GaAs grown layer approximately equal to the electron beam drawing interval.

Figure 4:
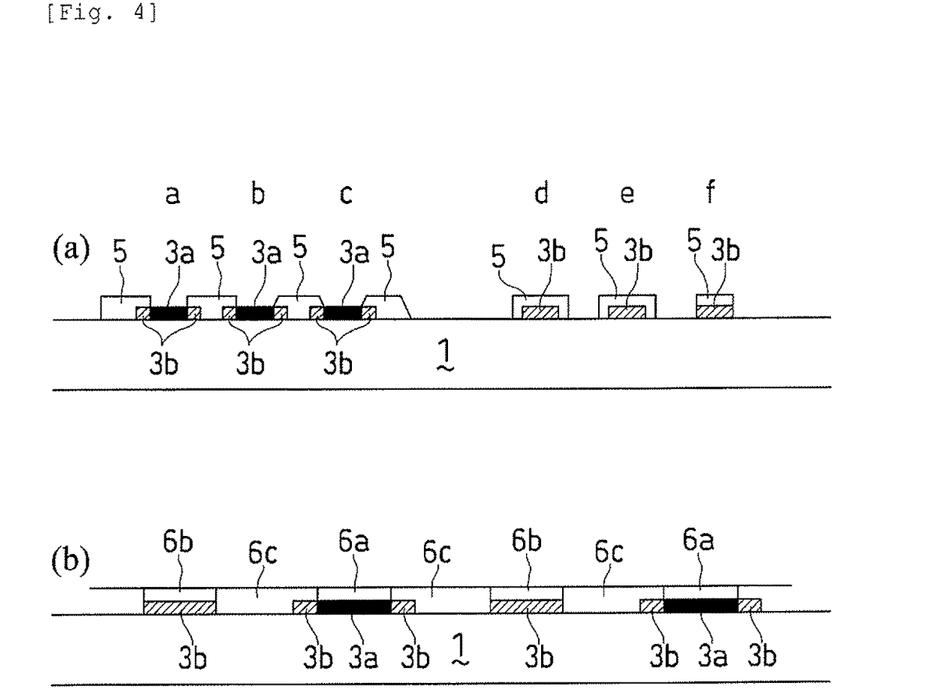
FIG. 4 is schematic views showing states where GaAs crystals have been grown by an MBE method in the state of FIG. 3, wherein (a) is a schematic view in a case with a small MBE growth, and (b) is a schematic view in a case with a large MBE growth.

Then, Ga atoms supplied were first adhered to the surface of the GaAs layer excluding parts where $Ga_2O_3$ had been formed (the foregoing mask 3a), and by self-assembling around the same as a nucleus (starting point), GaAs grown crystals 5 were formed, as shown in the left side of FIG. 4(*a*). Namely, the $Ga_2O_3$ (the aforementioned mask 3a) as a reformed natural oxide layer functioned as repulsive sites (positive-type mask).

Here, for the above-described mask 3a, a case where this disappears as a result of sublimation during the crystal growth of GaAs and a case where this remains as in FIG. 4(*a*) without disappearing can be considered.

Herein, the GaAs crystal growth rate was regulated by use of a reflection-high energy electron diffraction device (hereinafter, referred to as a "RHEED") for an in-situ observation of a surface condition of a sample thin layer or substrate. At this time, if a GaAs crystal growth rate is determined, the layer thickness and shape of the GaAs grown crystals 5 can be controlled by a regulation of GaAs crystal growth time. By such control, it is possible to prepare a substrate which is high in density and which has a fixed layer thickness among respective GaAs grown crystals 5.

As shown in the above, according to this mask forming method according to the first embodiment comprises the steps of: (1) selectively irradiating an electron beam 4a onto a natural oxide layer 2 formed on a surface of a GaAs layer 1; (2) removing, of the natural oxide layer 2, parts other than parts onto which the electron beam 4a has been irradiated, by heating; and (3) partially removing the natural oxide layer 2 of the parts onto which the electron beam 4a has been irradiated, by heating while alternatively carrying out a rise and fall in heating temperature.

Accordingly, by irradiating, without removing the natural oxide layer 2 of $As_2O_3$ or the like naturally formed on the surface of the GaAs layer 1, the electron beam 4a onto this natural oxide layer 2, it is possible to form chemically stable $Ga_2O_3$ (a mask 3a) on the surface. In addition, since a minute mask 3a having a width smaller than a diameter of the electron beam 4a can be formed, it becomes unnecessary to irradiate the electron beam 4a with a small beam diameter, thus no expensive electron beam drawing device is required. Further, it is unnecessary to make the acceleration voltage high for narrowing a diameter of the electronic beam down. Here, by applying patterning with the electron beam 4a to the natural oxide layer 2a so as to become a predetermined circuit pattern, a desirable circuit pattern can be processed on the surface of the GaAs layer 1.

In addition, since the natural oxide layer 2 naturally formed on the GaAs layer 2 plays a role of a type of inorganic resist, an organic resist-free condition can be realized, which makes a mask raw material unnecessary. In addition, it is also unnecessary to previously coat a resist material on the surface of the GaAs layer 1, the number of man-hours can be reduced. Moreover, sensitivity of the natural oxide layer 2 in such a case where the electron beam 4a is used as in the present embodiment is higher than that of RMMA, which has been generally used as an organic resist in exiting electron beam lithography. Accordingly, extremely high-speed drawing is possible, and throughput, which has been considered a problem in a case where an inorganic resist is used, can also be greatly improved.

Here, although the electron beam 4a has been employed as an energy beam in the present embodiment, as a problem of electron beam lithography (including a case where an organic resist is used), it has been generally mentioned that a region which is considerably larger than the beam diameter of the electron beam 4a becomes a resist reactive region owing to an influence (the above-described proximity effect) of secondary electron scattering from the inside of the substrate. Although a lot of proposals have been made to lower this proximity effect, in fact this proximity effect has been a great obstacle to miniaturization. In this respect, according to the mask forming method of the present embodiment, since only a part corresponding to a forward scattering component of the electron beam 4a which has been made incident (a part corresponding to the electron beam diameter) can be left by removing only a part reformed by secondary electron scattering (proximity effect) of the natural oxide layer, an effect equivalent to a correction of the above-described proximity effect can be realized. Not only that, it is also possible to leave only a part narrower than the beam diameter of the electron beam 4a.

In addition, in the present embodiment, a rise and fall in temperature has been intentionally repeated to control the heating temperature so as to dynamically pass the phase transition point of the surface of the GaAs layer 1 in the above-described step 3. Thereby, a mask formation on an order markedly smaller than the diameter of the irradiated electron beam 4a (for example, a nanometer order) can be made possible.

In addition, in the present embodiment, since direct drawing (mask-less lithography) to the natural oxide layer 2 has been realized, a mask for projection (a so-called reticle), whose price has surged in recent years, can be made unnecessary.

Furthermore, in the present embodiment, by selectively growing GaAs crystals 5 on the surface of the GaAs layer 1 by the MBE method after forming the above-described minute mask 3a, self-assembled microstructures have been formed. Accordingly, the natural oxide layer 3a has a mask functions as repulsive sites (a positive-type mask), and plays a role as a repulsive site trigger for a nucleus formation to diffusion of Ga atoms, and thereafter, the GaAs crystals gradually grow while performing self-assembly, therefore, by appropriately controlling the growth conditions, three-dimensional structures with extremely minute intervals can be realized irrespective of the mask 3a width. For example, in a case where array structure is microfabricated by use of the above-described method, the interval between adjacent unit structures can be controlled to become a desirable interval from zero to a few micrometers (irrespective of the mask 3a width).

Second Embodiment

Figure 3:
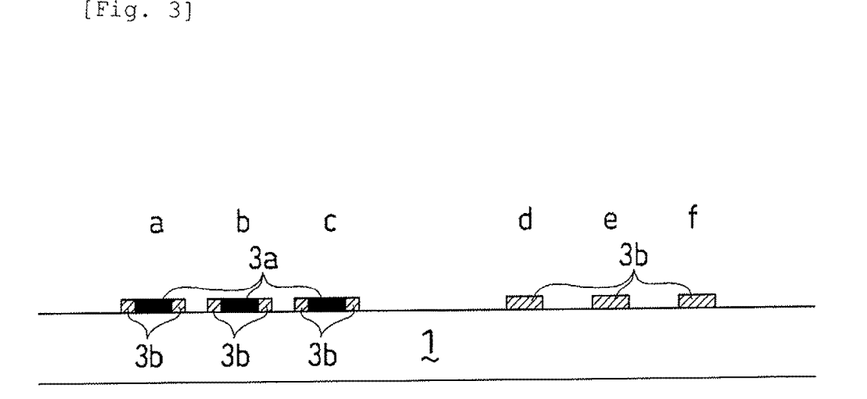
FIG. 3 is a schematic view showing a state where a positive-type mask and a negative-type mask have been selectively formed.

In this second embodiment, as shown in the right side of FIG. 1, by irradiating an electron beam 4b onto a natural oxide layer 2 of a GaAs substrate 1 and carrying out heating completely the same as the above, a minute mask 3b with a 10 nm width as shown in the right side of FIG. 3 was formed. Here, irradiating conditions of the electron beam 4b were completely the same as those of the foregoing first embodiment expect for that the amount of line Dowes was provided as $2.5 \times 10^9$ electron/cm.

Then, by an MBE method, GaAs was selectively grown on the GaAs layer 1 of the side where the natural oxide layer 2 had been desorbed. Then, at the initial stage of diffusion, Ga atoms adhered to parts (mask 3b) where $Ga_2O_3$ had been formed (unlike the foregoing first embodiment), and by self-assembly around the same as a nucleus, GaAs grown crystals 5 were formed as shown in the right side of FIG. 4(*a*). Namely, the $Ga_2O_3$ (mask 3b) as a reformed natural oxide layer functioned as adsorptive sites (negative-type mask).

Here, for the $Ga_2O_3$ as a mask, a case where this disappears as a result of sublimation during the crystal growth of GaAs and a case where this is covered with the GaAs grown crystals 5 as shown in the right side of FIG. 4(*a*) can be considered.

The following knowledge is obtained by the foregoing first embodiment and second embodiment. Namely, as shown in FIG. 1, when irradiating the electron beam 4a,4b onto the natural oxide layer 2, by differentiating the amount of line Dowes thereof, the degree and mode of reformation of the single natural oxide layer 2 can be differentiated so as to function not only as repulsive sites (positive-type mask) 3a but also as adsorptive sites (negative-type mask) 3b. Accordingly, if the electron beam 4a,4b is irradiated onto the identical substrate 1 while differentiating the amount of line Dowes, it is possible to make parts of the single natural oxide layer 2 function as repulsive sites (positive-type mask) 3a and make the rest thereof function as adsorptive sites (negative-type mask) 3b. As a result, the degree of freedom of control by selective growth of GaAs by the MBE method as in the above is increased, and various shapes of three-dimensional microindentations can be formed.

As an example according to another combination in the case of covering with GaAs grown crystals 5 as shown in FIG. 4(*a*) by the foregoing first embodiment and second embodiment, one shown in FIG. 4(*b*) is possible. In this FIG. 4(*b*), by alternatively applying an electron beam irradiation of the electron beams 4*a*,4*b* to the surface of the substrate 1 as in FIG. 1, parts of the single natural oxide layer 2 were formed into repulsive sites (positive-type mask) 3*a* and other parts thereof were formed into adsorptive sites (negative-type mask) 3*b* so that the adsorptive sites 3*b* are arranged on both sides of the repulsive sites 3*a* and both masks 3*a* and 3*b* are alternatively lined. And, as an amount of selective growth of GaAs by the MBE method as described above, an example of a growth by an amount considerably greater than that in the aforementioned case of FIG. 4 is shown in FIG. 4(*b*).

In this example of FIG. 4(*b*), as a result of growth by the MBE method, a GaAs amorphous crystal growth 6*a* was formed on surfaces of the repulsive sites (positive-type mask) 3*a*. In addition, a GaAs monocrystal growth 6*b* was formed on the surface of the adsorptive sites (negative-type mask) 3*b*. Furthermore, on the surface of the substrate 1 where neither positive-type nor negative-type mask was present, a GaAs monocrystal growth 6*c* was formed. This example suggests potentialities of three-dimensional minute shapes by controls of the selective growth amount of GaAs by presence of the positive-type mask and negative-type mask and the MBE method.

Third Embodiment

Figure 5:
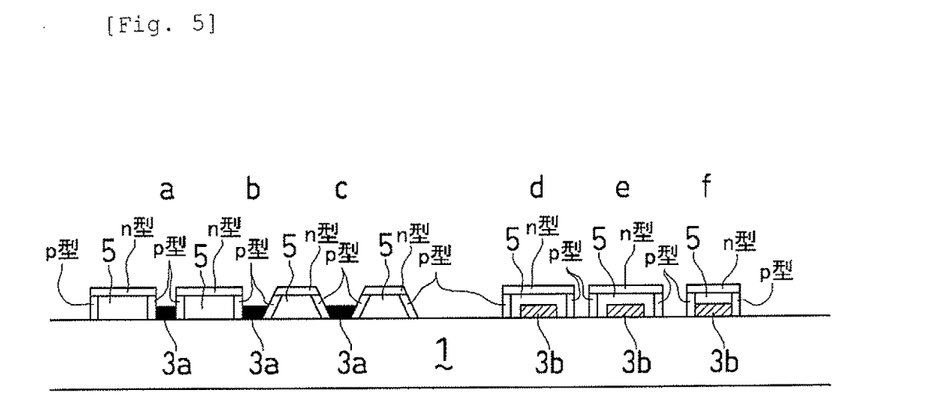
FIG. 5 is a schematic view showing a state where Si has been supplied as molecular beams to form n-channels and p-channels in the state of FIG. 4(a).

In this third embodiment, onto a GaAs substrate 1, GaAs crystals were grown by self-assembly by means of a technique the same as that of the foregoing first embodiment or second embodiment, a high-density array structure was formed as in FIG. 4(*a*). Thereafter, Si as being a dopant was supplied as molecular beams. Then, as shown in FIG. 5, an n-channel was formed on a facet surface (crystal orientation (100) surface) of each GaAs grown crystal 5, and p-channels were formed on other facet surfaces (crystal orientation (n11) A surface, n is 3, for example) were formed.

By this method of the third embodiment, a large number of minute transistor structures could be formed by fewer steps. In other words, p-n control of a surface of each unit structure of a high-density array structure could be carried out in a lump.

Fourth Embodiment

In this fourth embodiment, by irradiating an electron beam 4*a*,4*b* onto a natural oxide layer 2 of a GaAs substrate 1 while changing the amount of line Dowes to two types of $2.5 \times 10^{10}$ electron/cm and $2.5 \times 10^{9}$ electron/cm and, thereafter, carrying out a heating process completely the same as described above, a positive-type mask 3*a* and a negative-type mask 3*b* were formed at a 10 nm width as shown in FIG. 4(*a*).

Figure 6:
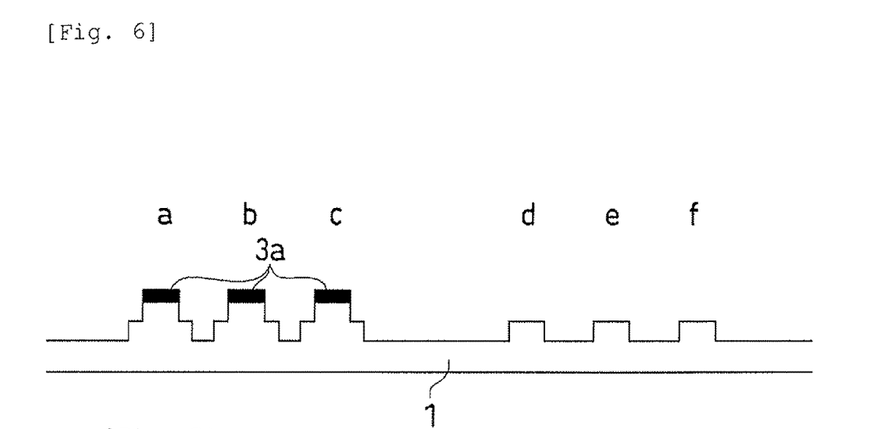
FIG. 6 is a schematic view showing a state where dry etching by $AsBr_3$ has been performed in the state of FIG. 3.

Next, in, for example, an ultra high vacuum of a $10^{-7}$ Pa level, by introducing $AsBr_3$ (bromide) under a V family molecular gas partial pressure of $10^{-3}$ Pa to $10^{-7}$ Pa at 580° C. to 630° C. for 5 minutes as molecular beams, the surface of a GaAs layer 1 was dry-etched for every single layer of atomic layers. Then, as shown in FIG. 6, parts where the above-described mask 3*a*, 3*b* ($Ga_2O_3$), which is a chemically stable oxide layer, had been formed were left entirely or partially without being etched. Namely, selective etching was carried out, thus minute three-dimensional structures could be processed on the surface of the GaAs layer 1.

Here, although the positive-type mask 3*a* remained to the last on the surface of the GaAs layer 1 throughout the whole of the above-described dry etching step, the negative-type mask 3*b* disappeared halfway therethrough, and then, parts (d to f) corresponding to the negative-type mask 3*b* were also etched. Consequently, as shown in FIG. 6, etching could be carried out so that there is a difference in elevation between the positive-type mask 3*a* parts (a to c) and negative-type mask 3*b* parts (d to f), that is, these are different in aspect ratios. This means that the foregoing natural oxide layer 2 can function as a so-called analog-type inorganic resist. Namely, since the negative-type mask 3*b* is lower in crystallinity of $Ga_2O_3$ than the positive-type mask 3*a* and is provided with numerous pores (being a soft mask), etching can be carried out so that there is a difference in elevation as described above between the negative type and positive type.

[Examples of Three-Dimensional Microstructures]

Figure 8:
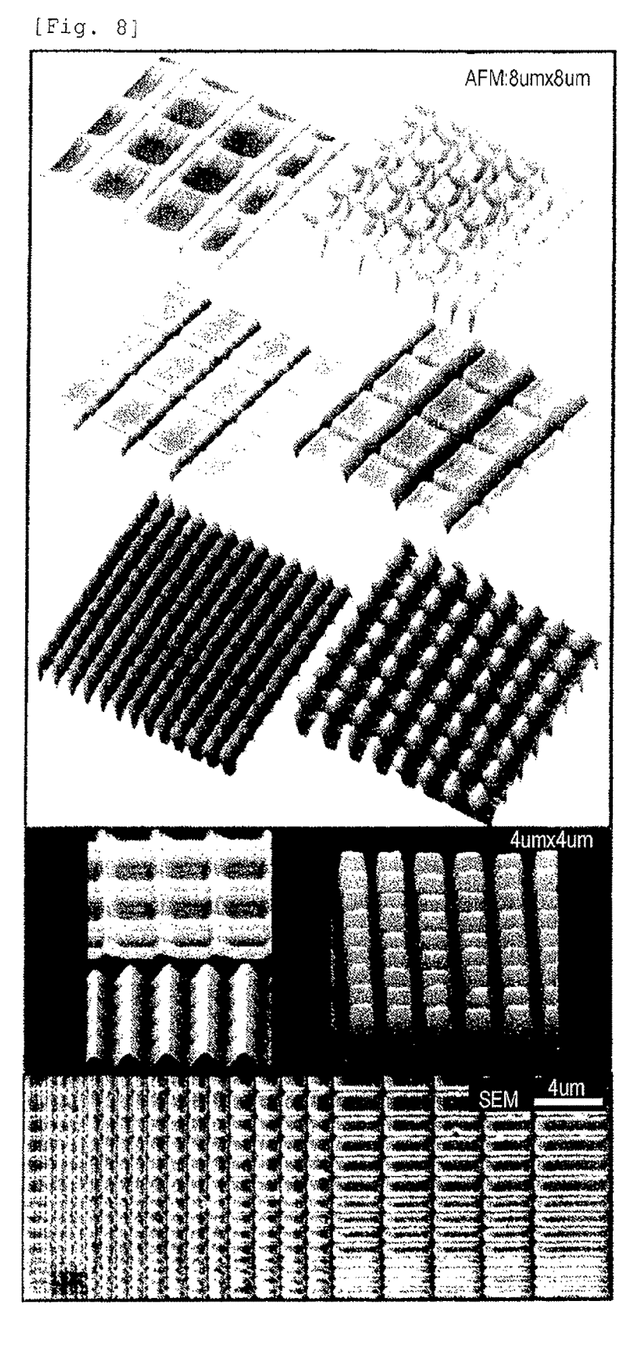
FIG. 8 is a view showing substrate surfaces after three-dimensional microfabrication of the present invention has been applied.

Here, in FIG. 8, various examples of three-dimensional microindentations processed by the present invention are shown. For this FIG. 8, microindentations which had been formed by the method according to the present invention were actually photographed by use of an atomic force microscope (AFM) or scanning electron microscope (SEM). Here, the present invention is particularly effective when forming a minute and high-density array structure as shown in various types in FIG. 8.

[Modification]

Although preferred embodiments of the present invention have been shown in the above, the above-described embodiments can be carried out by modifications as in, for example, the following.

(1) Although a description has been given of a GaAs layer in the above-described embodiments, effects the same as those in the above-described case of a GaAs layer are provided as long as the layer is an $Al_XGa_YIn_{1-X-Y}As_ZP_{1-Z}$ or $Al_XGa_YIn_{1-X-Y}N_ZAs_{1-Z}$ layer, therefore, application of the present invention is not limited to a GaAs layer. In addition, as a III-V family compound to be selectively grown, without limitation to GaAs, for example, GaN, InAs, InP, or InSb can be employed.

(2) As energy beams to be irradiated onto a natural oxide layer, without limitation to electron beams, for example, any of ion beams, laser beams, and inferred beams can be utilized by selection.

(3) For processing of three-dimensional microindentations, an MBE method as in the first embodiment and dry etching as in the fourth embodiment can also be used by combination. In this case, three-dimensional microindentations of a further variety of shapes can be formed. In this case, it is extremely desirable that crystal growth by the MBE method and dry etching are performed by an identical device in a series of steps. This is because employment of a single vacuum system makes it possible to carry out an "in-situ" observation and evaluation of the surfaces and interfaces during processing by means of electron beams (above-described RHEED) and X-rays, and pollution of the surfaces of three-dimensional structures to be formed can be extremely satisfactorily avoided.

(4) The etchant gas for dry etching in the above-described fourth embodiment is not limited to $AsBr_3$ as described above, and for example, a bromide such as, for example, $PBr_3$, $GaBr_3$, or $InBr_3$ can be employed.

(5) The mask forming method and three-dimensional microfabrication method of the above-described embodiments can be applied to wavelength discriminating devices,

What is claimed is:

1. A mask forming method for forming a selective mask on a surface of a layer of $Al_XGa_YIn_{1-X-Y}As_ZP_{1-Z}$ or $Al_XGa_YIn_{1-X-Y}N_ZAs_{1-Z}$ ($0 \leq X \leq 1, 0 \leq Y \leq 1, 0 \leq Z \leq 1$), comprising the steps of:
   (1) selectively irradiating an energy beam onto a natural oxide layer formed on the surface of the layer of $Al_XGa_YIn_{1-X-Y}As_ZP_{1-Z}$ or $Al_XGa_YIn_{1-X-Y}N_ZAs_{1-Z}$;
   (2) removing, of the natural oxide layer, parts other than parts onto which the energy beam has been irradiated, by heating; and
   (3) partially removing the natural oxide layer of the parts onto which the energy beam has been irradiated, by heating while alternatively carrying out a rise and fall in heating temperature.

2. The mask forming method according to claim 1, wherein in the step (3), although a semiconductor surface forms a different stable re-composite surface depending on the temperature in vacuum, by producing a dynamic stride across a phase transition point where re-composition changes by intentionally repeating a rise and fall in temperature, the natural oxide layer excluding minute center parts onto which the energy beam has been irradiated and which is great in intensity of energy intensity distribution is removed.

3. The mask forming method according to claim 1, wherein in the step (1), any of an electron beam, an ion beam, a laser beam, and an infrared rays is employed as the energy beam.

4. A three-dimensional microfabrication method, wherein self-assembled microindentations are formed by selectively growing III-V family compound semiconductor crystals on the surface of the layer of $Al_XGa_YIn_{1-X-Y}As_ZP_{1-Z}$ or $Al_XGa_YIn_{1-X-Y}N_ZAs_{1-Z}$ by a molecular beam epitaxial growth method after forming a selective mask by the mask forming method according to claim 1.

5. The three-dimensional microfabrication method according to claim 4, wherein by supplying a dopant after the selective self-assembly growth of the III-V family compound semiconductor crystals, n-channels are self-formed on some facet surfaces of the III-V family compound semiconductor crystals and p-channels are self-formed on other facet surfaces respectively.

6. The three-dimensional microfabrication method according to claim 5, wherein by supplying Si as the dopant as molecular beams, n-type semiconductors are formed on crystal orientation (100) surfaces and p-type semiconductors are formed on crystal orientation (n11) A surfaces in an identical step.

7. A three-dimensional microfabrication method, wherein microindentations are formed in nano-order on the surface of the layer of $Al_XGa_YIn_{1-X-Y}As_ZP_{1-Z}$ or $Al_XGa_YIn_{1-X-Y}N_ZAs_{1-Z}$ by dry etching by supplying a bromide as molecular beams after forming a selective mask by the mask forming method according to claim 1.

8. The mask forming method according to claim 1, wherein by selectively irradiating the energy beam while changing the amount of Dowes in the step (1), parts of the natural oxide layer are made to function as a negative-type mask, and parts are made to function as a positive-type mask.

9. A three-dimensional microfabrication method, wherein self-assembled microindentations are formed by selectively growing III-V family compound semiconductor crystals on the surface of the layer of $Al_XGa_YIn_{1-X-Y}As_ZP_{1-Z}$ or $Al_XGa_YIn_{1-X-Y}N_ZAs_{1-Z}$ by a molecular beam epitaxial growth method after forming a negative-type mask and a positive-type mask by the mask forming method according to claim 8.

10. The three-dimensional microfabrication method according to claim 9, wherein microindentations are selectively formed in nano-order by self-assembly growth of III-V family compound semiconductor crystals on a rear surface of the negative-type mask and by self-assembly growth of III-V family compound semiconductor crystals at gaps without the positive-type mask.

11. A three-dimensional microfabrication method, wherein microindentations are formed in nano-order on the surface of the layer of $Al_XGa_YIn_{1-X-Y}As_ZP_{1-Z}$ or $Al_XGa_YIn_{1-X-Y}N_ZAs_{1-Z}$ by dry etching by use of a bromide after forming a negative-type mask and a positive-type mask by the mask forming method according to claim 8.

12. The mask forming method according to claim 2, wherein in the step (1), any of an electron beam, an ion beam, a laser beam, and an infrared rays is employed as the energy beam.

13. A three-dimensional microfabrication method, wherein self-assembled microindentations are formed by selectively growing III-V family compound semiconductor crystals on the surface of the layer of $Al_XGa_YIn_{1-X-Y}As_ZP_{1-Z}$ or $Al_XGa_YIn_{1-X-Y}N_ZAs_{1-Z}$ by a molecular beam epitaxial growth method after forming a selective mask by the mask forming method according to claim 3.

14. A three-dimensional microfabrication method, wherein microindentations are formed in nano-order on the surface of the layer of $Al_XGa_YIn_{1-X-Y}As_ZP_{1-Z}$ or $Al_XGa_YIn_{1-X-Y}N_ZAs_{1-Z}$ by dry etching by supplying a bromide as molecular beams after forming a selective mask by the mask forming method according to claim 3.

15. The mask forming method according to claim 3, wherein by selectively irradiating the energy beam while changing the amount of Dowes in the step (1), parts of the natural oxide layer are made to function as a negative-type mask, and parts are made to function as a positive-type mask.

* * * * *